United States Patent
Kang

(10) Patent No.: US 6,184,927 B1
(45) Date of Patent: Feb. 6, 2001

(54) METHODS OF FORMING FERROELECTRIC CAPACITORS HAVING A DIFFUSION BARRIER LAYER

(75) Inventor: Eung Youl Kang, Kyoungkido (KR)

(73) Assignee: Hyundai Electronics Industries Co., Ltd. (KR)

( * ) Notice: Under 35 U.S.C. 154(b), the term of this patent shall be extended for 0 days.

(21) Appl. No.: 09/223,470

(22) Filed: Dec. 30, 1998

(30) Foreign Application Priority Data

Dec. 30, 1997 (KR) .................................................. 97 77974

(51) Int. Cl.⁷ ................................................ H01L 21/8239
(52) U.S. Cl. .............................. 348/240; 438/3; 438/393; 438/396
(58) Field of Search ................................ 438/240, 3, 396, 438/397, 399, 239, 256, 393

(56) References Cited

U.S. PATENT DOCUMENTS

| | | |
|---|---|---|
| 5,436,490 | 7/1995 | Nakamura . |
| 5,554,564 | 9/1996 | Nishioka et al. . |
| 5,708,284 | 1/1998 | Onishi . |
| 5,760,433 * | 6/1998 | Ramer et al. .......................... 257/295 |
| 5,790,366 * | 8/1998 | Desu et al. ............................ 361/305 |
| 5,793,600 | 8/1998 | Fukuda et al. . |
| 5,902,131 * | 5/1999 | Argos et al. ........................... 438/618 |
| 5,976,928 * | 11/1999 | Kirlin et al. .......................... 438/240 |
| 6,011,284 * | 1/2000 | Katori .................................... 257/295 |
| 6,048,740 * | 4/2000 | Hsu ........................................... 438/3 |
| 6,115,281 * | 9/2000 | Aggarwal ............................. 365/145 |

FOREIGN PATENT DOCUMENTS

| | | |
|---|---|---|
| 4-344384 | 11/1992 | (JP) . |
| 4-360507 | 12/1992 | (JP) . |
| 6-162857 | 6/1994 | (JP) . |

* cited by examiner

Primary Examiner—Mary Wilczewski
Assistant Examiner—David Goodwin
(74) Attorney, Agent, or Firm—Blakely Sokoloff Taylor & Zafman

(57) ABSTRACT

Provided is a method for forming a ferroelectric capacitor of a semiconductor, which prevents the breakdown of a ferroelectric film induced from the out-diffusion of ingredients of the ferroelectric film. Using a thin film of SBT or $Bi_2O_3$ as a diffusion barrier layer capping the SBT ferroelectric film can prevent the breakdown of the ferroelectric film induced from the subsequently proceeded thermal treatment process at high temperature. As a result, the invention can decrease the fatigue of the device and enhance margin in the processes and the reliability of the device.

6 Claims, 3 Drawing Sheets

METHODS OF FORMING FERROELECTRIC CAPACITORS HAVING A DIFFUSION BARRIER LAYER

FIELD OF THE INVENTION

The present invention relates to technology about semiconductor memory devices; and, more particularly, to methods for forming ferroelectric capacitors of semiconductor devices which have a diffusion barrier layer preventing the breakdown of a ferroelectric thin film used as a dielectric film of a capacitor in Ferroelectric RAM (FeRAM)

DESCRIPTION OF THE PRIOR ART

As well known, FeRAM includes transistor, bitline, and a ferroelectric capacitor having a ferroelectric thin film. It is necessary to form a diffusion barrier layer for protecting the properties of the ferroelectric thin film in this ferroelectric capacitor since the properties of the ferroelectric thin film may be greatly changed as changing its composition and greatly affected by the thermal treatment conditions of the following processes or the following processes themselves. It is also necessary to cap the ferroelectric film using a diffusion barrier layer in order to decrease edge effect since the edge effect is increased with decreasing the capacitor size particularly in highly integrated FeRAM.

Hereinafter, referring to FIG. 1, a method for forming FeRAM according to the prior art and its drawbacks will be illustrated.

First, a film of platinum 12 and a thin film of ferroelectric material 13 are formed, in turn, over a silicon substrate 11 on which predetermined processes are completed and patterned. The film of platinum 12 is a bottom electrode connected to the substrate 11. A film of $TiO_2$ 16 as a diffusion barrier layer is then deposited and selectively etched to expose the ferroelectric film 13. Subsequently, an upper electrode 14 is formed so as to contact with the exposed ferroelectric film 13, thereby completing a FeRAM.

In the processes, when PZT is used as a material of the ferroelectric film, the film of $TiO_2$ 16 can depress the diffusion of a ingredient of PbO or the other ingredients in the film of PZT and minimize the change of the composition of the PZT ferroelectric film, thereby preventing the breakdown of the PZT ferroelectric film. However, when strontium bismuth tantalate (SBT) is used as a material of the ferroelectric film, it results in problems as described below.

The oxygen in the SBT ferroelectric thin film has relatively high binding energy with $TiO_2$. Therefore, when the oxygen is activated by a process of thermal treatment, it is diffused to the film of $TiO_2$ and, thus, transforms the perovskite structure of the SBT ferroelectric film to non-stoichiometry state. The atomic radius of Ti is also smaller than the ingredients of SBT. Therefore, Ti may be entered into the ferroelectric film to result in defects of the ferroelectric film. This may cause deterioration of the electric properties of the ferroelectric capacitor and break the ferroelectric film.

As described above, it is not appropriate to form an excellent film of diffusion barrier for the SBT ferroelectric film using the prior method. Accordingly, it is required to develop a new method for forming a film of diffusion barrier in the ferroelectric capacitor.

SUMMARY OF THE INVENTION

It is, therefore, an object of the present invention to provide a method for forming a ferroelectric capacitor of a semiconductor which has a film of diffusion barrier to prevent the breakdown of a ferroelectric film induced from the out-diffusion of ingredients of the ferroelectric film.

In accordance with one embodiment of the present invention, there is provided a method for forming a ferroelectric capacitor of semiconductor which comprises the steps of: forming a lower electrode connected to a substrate; forming a ferroelectric thin film of SBT on the lower electrode; forming a SBT thin film as a diffusion barrier layer in order to prevent the out-diffusion of the ingredients or dopant of the ferroelectric film; selectively etching the SBT thin film to expose the SBT ferroelectric film; and forming an upper electrode contacted with the exposed SBT ferroelectric film.

In accordance with another embodiment of the present invention, there is provided a method for forming a ferroelectric capacitor of semiconductor which comprises the steps of: forming a lower electrode connected to a substrate; forming a ferroelectric thin film of SBT on the lower electrode; forming a thin film of $Bi_2O_3$ as a diffusion barrier layer in order to prevent the out-diffusion of the ingredients or dopant of the ferroelectric film; selectively etching the $Bi_2O_3$ thin film to expose the SBT ferroelectric film; and forming an upper electrode contacted with the exposed SBT ferroelectric film.

Using a thin film of SBT or $Bi_2O_3$ as a diffusion barrier layer of the SBT ferroelectric capacitor according to the present invention can prevent the breakdown of the ferroelectric film induced from the subsequently proceeded thermal treatment process at high temperature. As a result, the invention can decrease the fatigue of the device and enhance margin in the processes and the reliability of the device.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiment with reference to the accompanying drawings.

Figure 1:
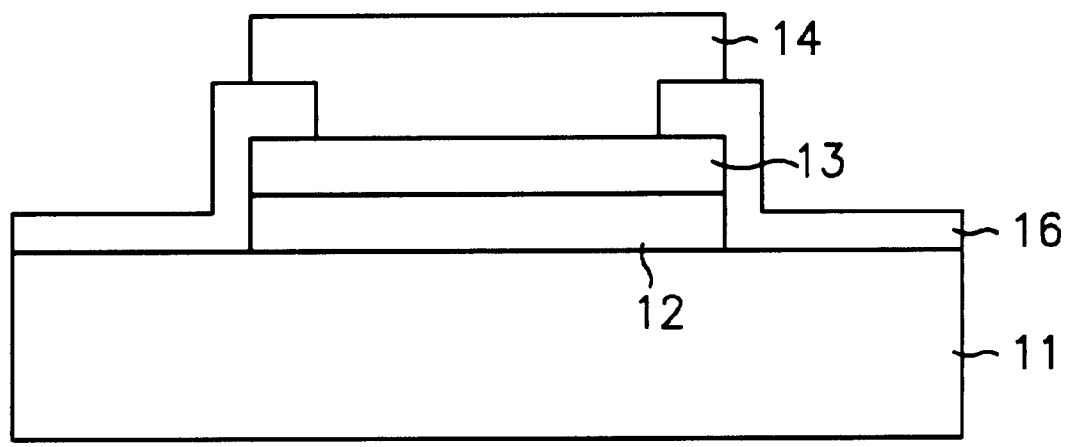
FIG. 1 shows a capacitor structure of FeRAM formed according to the prior art.
Figure 2A:
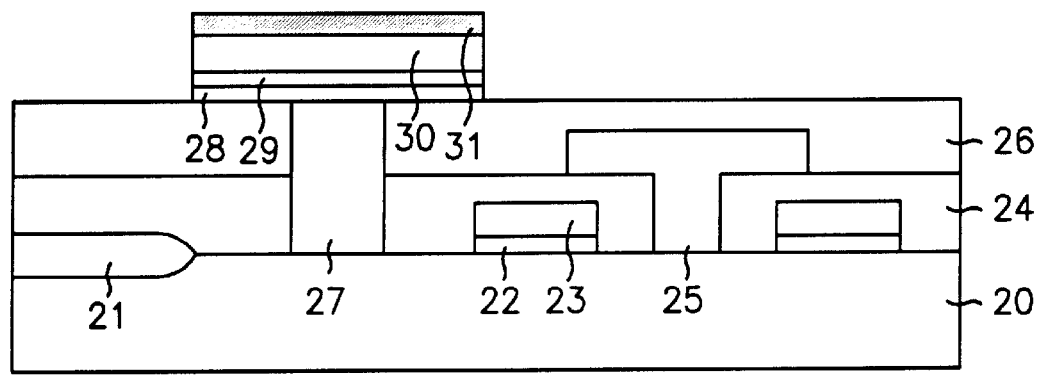
FIGS. 2a to 2d depict, schematically, various steps in the formation of the ferroelectric capacitor of FeRAM according to one preferred embodiment of the present invention.

First, referring to FIG. 2a, a field oxide 21 is formed over a silicon substrate 20 to isolate an element-forming region from a field region. In the element forming region, a transistor including a gate oxide film 22, a polysilicon film 23, and source or drain region (not shown) is formed, and a first insulating film, for example, a first inter poly oxide (IPO) film 24 is formed to insulate the transistor. The formed first IPO film 24 is selectively etched to form a contact hole. The contact hole is buried to form a bitline 25 contacted with the source or drain region of the transistor. After a second IPO film 26 is formed over the entire structure, the second IPO film 26 and the first IPO film 24 are etched, in turn, to form a contact hole for charge storing electrode. Polysilicon is then deposited in the contact hole and a chemical mechanical polishing process is performed. Thus, the polysilicon film 27 exists only in the contact hole. Subsequently, a film of Ti 28 directly contacted with the polysilicon film 27 and a film of TiN are formed, in turn, as films of metal diffusion barrier. A first electrode of platinum 30 and a ferroelectric thin film of SBT 31 are, in turn, deposited. After a photomask process, the ferroelectric thin film of SBT 31, the first electrode of platinum 30, the film of TiN 29 and the film of Ti 28 are selectively etched.

Figure 2B:
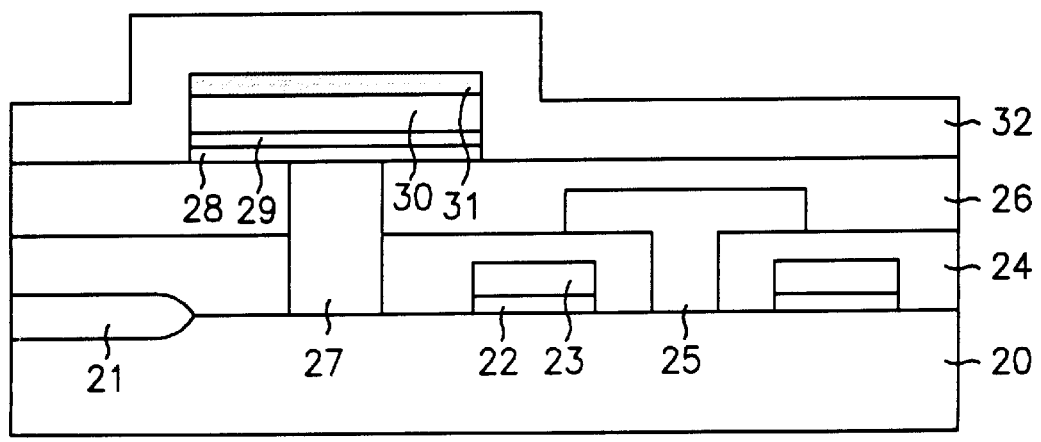

Next, referring to FIG. 2b, a SBT film 32 is formed as a diffusion barrier film over the entire structure by sputtering method or liquid source mist chemical deposition (LSMCD) method. The SBT film 32 is formed to a thickness of about 500 to 1000 Å, and may be displaced by $Bi_2O_3$.

The film of SBT 32 or $Bi_2O_3$ is the same as the ingredient of the ferroelectric film. Thus, out-diffusion of Bi or other ingredients of the ferroelectric film is prevented. Repeatedly speaking, though the out-diffusion of the Bi is generated in the surface of the diffusion barrier film, the Bi is out-diffused only near the surface. Thus, the out-diffusion of the SBT ferroelectric film capped by the diffusion barrier film is suppressed. As a result, the composition and structure of the ferroelectric film are not changed and, thus, its properties are maintained.

Figure 2C:
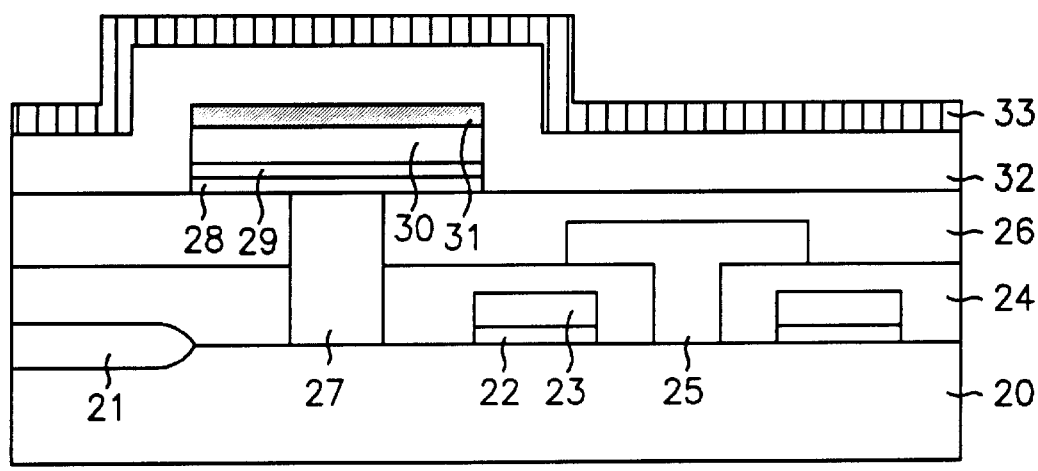

Next, referring to FIG. 2c, a film of $TiO_2$ 33 is formed on the SBT film 32. The film of $TiO_2$ is formed because the film of $TiO_2$ is more excellent in the property of diffusion barrier for dopants. The film of $TiO_2$ 33 may be displaced by a film of TiN. It should be also understood that only the SBT film 32 could play a sufficient role of diffusion barrier without the film of $TiO_2$ 33 in order to achieve the purpose of the invention.

Figure 2D:
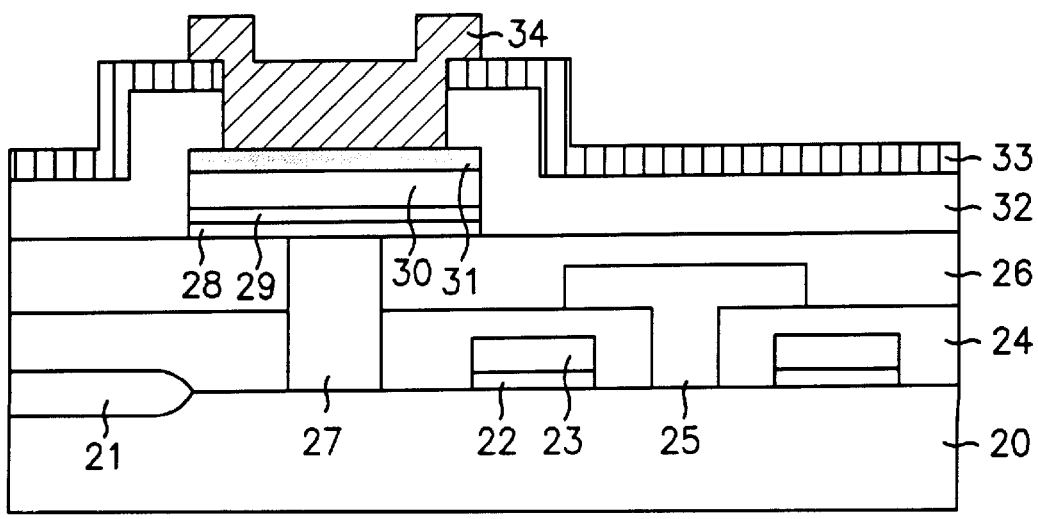

Finally, referring to FIG. 2d, the film of $TiO_2$ 33 and the SBT film 32 are, in turn, etched to expose the ferroelectric film 31. After that, a second electrode of platinum 34 is formed to make a FeRAM.

While the present invention has been described with respect to certain preferred embodiments only, other modifications and variations may be made without departing from the spirit and scope of the present invention as set forth in the following claims.

What is claimed is:

1. A method for forming a ferroelectric capacitor of semiconductor which comprises the steps of:

forming a lower electrode formed on top of a substrate;

forming a ferroelectric film of SBT on the lower electrode;

forming a SBT film as a diffusion barrier layer in order to prevent the out-diffusion of the ingredients or dopants of the SBT ferroelectric film;

selectively etching the diffusion barrier SBT film to expose the SBT ferroelectric film; and forming an upper electrode contacted with the exposed SBT ferroelectric film.

2. The method according to claim 1, wherein after the step of forming the diffusion barrier SBT film, the method further comprises the step of forming a film of $TiO_2$ or TiN on the SBT film.

3. The method according to claim 2, wherein the thickness of the diffusion barrier SBT film is 500 to 1000 Å.

4. A method for forming a ferroelectric capacitor of semiconductor which comprises the steps of:

forming a lower electrode connected to a substrate;

forming a ferroelectric thin film of SBT on the lower electrode;

forming a thin film of $Bi_2O_3$ as a diffusion barrier layer in order to prevent the out-diffusion of the ingredients or dopants of the ferroelectric film;

selectively etching the $Bi_2O_3$ thin film to expose the SBT ferroelectric film; and forming an upper electrode contacted with the exposed SBT ferroelectric film.

5. The method according to claim 4, wherein after the step of forming the $Bi_2O_3$ film, the method further comprises the step of forming a film of $TiO_2$ or TiN on the $Bi_2O_3$ film.

6. The method according to claim 4, wherein the thickness of the $Bi_2O_3$ film is 500 to 1000 Å.

* * * * *